(12) United States Patent
Okamura

(10) Patent No.: US 7,129,795 B2
(45) Date of Patent: Oct. 31, 2006

(54) SEMICONDUCTOR INTEGRATED CIRCUIT WITH WIRING ARRANGEMENT FOR N-STAGE AMPLIFYING

(75) Inventor: Junichi Okamura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 83 days.

(21) Appl. No.: 10/488,693

(22) PCT Filed: Sep. 12, 2001

(86) PCT No.: PCT/JP01/07898

§ 371 (c)(1),
(2), (4) Date: Mar. 5, 2004

(87) PCT Pub. No.: WO03/026129

PCT Pub. Date: Mar. 27, 2003

(65) Prior Publication Data

US 2004/0212442 A1    Oct. 28, 2004

(51) Int. Cl.
*H03B 27/00* (2006.01)
(52) U.S. Cl. .......................... 331/57; 331/45
(58) Field of Classification Search .............. 331/57, 331/45
See application file for complete search history.

(56) References Cited

U.S. PATENT DOCUMENTS

| 5,239,274 A | 8/1993 | Chi et al. |
| 5,399,995 A | 3/1995 | Kardontchik et al. |
| 5,416,444 A * | 5/1995 | Yamauchi et al. ............ 315/45 |
| 5,420,547 A | 5/1995 | Kikuchi et al. |
| 6,025,756 A * | 2/2000 | Miyabe ....................... 331/57 |
| 6,559,727 B1 * | 5/2003 | Boerstler ..................... 331/57 |
| 6,731,179 B1 * | 5/2004 | Abadeer et al. ............. 331/57 |

FOREIGN PATENT DOCUMENTS

| EP | 0 785 622 A | 7/1997 |
| JP | 04-276919 A | 10/1992 |
| JP | 11-008533 A | 1/1999 |
| JP | 11-041076 A | 2/1999 |

* cited by examiner

*Primary Examiner*—Joseph Chang
(74) *Attorney, Agent, or Firm*—Sughrue Mion, PLLC

(57) ABSTRACT

A semiconductor integrated circuit in which, when leading out multiple-phase clock signal wirings from the ring oscillator circuit capable of oscillating at a high frequency, increase in the area of the substrate and deterioration in the clock phase accuracy caused by the non-uniform stray capacitances among the multiple-phase clock signal wirings are prevented. The semiconductor integrated circuit includes: N-stage amplifying circuits connected in a form of a ring to perform oscillating operation, which amplifying circuits are arranged in a semiconductor substrate to be divided into a plurality of rows, wherein in each row an amplifying circuit of "m–1"th stage and an amplifying circuit of "m"th stage are not adjacent to each other, where m is an arbitrary integer number within a range from 2 to N; and a plurality of wirings for respectively leading out a plurality of output signals from the amplifying circuits disposed in one of the plurality of rows.

9 Claims, 8 Drawing Sheets

SEMICONDUCTOR INTEGRATED CIRCUIT WITH WIRING ARRANGEMENT FOR N-STAGE AMPLIFYING

TECHNICAL FIELD

The present invention generally relates to a semiconductor integrated circuit, and in particular to a semiconductor integrated circuit including a ring oscillator circuit for generating multi-phase clock signals.

BACKGROUND ART

Recently, in the signal transmission between equipments, a system using a high-speed serial signal with small amplitude has been adopted. This system makes it possible, as compared with the technique wherein the digital signal is transmitted in parallel, to reduce electromagnetic interference (EMI) caused in the course of digital signal transmission, in addition to a requirement for only a small number of cables.

In order to achieve a high-speed serial communication, there is provided at the transmitting side a parallel-serial conversion circuit, which synchronizes with a base clock signal to convert parallel data into serial data by using sub clock signals with multi-phases (in this application, referred to as multi-phase clock signals) having a phase difference of equal intervals. Therefore there arises a need to provide a multi-phase clock generating circuit that generates the multi-phase clock signals and supply the multi-phase clock signals to the parallel-serial conversion circuit.

As the multi-phase clock generating circuit, there is used, for example, a voltage or current controlled differential ring oscillator circuit, which is constructed of multi-stage delay differential inverting amplification circuits connected to each other in the form of a ring. By using the differential ring oscillator circuit as described above, multi-phase clock signals having phase difference with equal intervals can be easily extracted from the multi-stage delay differential inverting amplification circuits. In order to generate the multi-phase clock signals having phase difference of precisely equal intervals from high-speed differential ring oscillator circuit, it is necessary to equalize the loads of the multi-stage delay differential inverting amplification circuits and also to equalize the stray capacitances of the multiple-phase clock signal wirings.

Conventionally, in order to equalize the load of each stage of delay differential inverting amplification circuits, N-stage delay differential inverting amplification circuits, which constitutes the differential ring oscillator circuit, are disposed in two rows on a semiconductor substrate, and in each row, there is made such an arrangement that the successive delay differential inverting amplification circuits are disposed adjacent to each other. By virtue of this arrangement, it is made possible to minimize the delay in the wirings between the output of one circuit and the input of the next circuit of the N-stage delay differential inverting amplification circuits, and to achieve a differential ring oscillator circuit capable of oscillating at a high frequency.

However, in the differential ring oscillator circuit that outputs multi-phase clock signals having phase difference of equal intervals and is required for achieving the high speed serial communication, multi-phase clock signals are generally extracted from the outputs of the alternate delay differential inverting amplification circuits. Accordingly, signals are extracted from each row of the delay differential inverting amplification circuits disposed in two rows. Consequently, according to the conventional arrangement and wirings, the length of the wirings for the multi-phase clock signals of one row becomes longer than that of another row, and therefore, there arises a difficulty to make uniform all stray capacitances of the multiple-phase clock signal wirings. Also, the layout of the multiple-phase clock signal wirings has to be made in a relatively wide area in the periphery of the differential ring oscillator circuit. For this reason, there arises such problem that the area of the semiconductor substrate becomes larger.

DISCLOSURE OF THE INVENTION

Accordingly, in view of the above-mentioned problems, an object of the present invention is to provide a semiconductor integrated circuit in which, when leading out or extracting multiple-phase clock signal wirings from the ring oscillator circuit capable of oscillating at a high frequency, increase in the area of the substrate and deterioration in the clock phase accuracy caused by the non-uniform stray capacitances among the multiple-phase clock signal wirings are prevented.

In order to solve the above-mentioned problems, a semiconductor integrated circuit according to a first aspect of the present invention comprises: N-stage amplifying circuits (N is a natural number) connected in a form of a ring to perform oscillating operation, which amplifying circuits are arranged in a semiconductor substrate to be divided into a plurality of rows, wherein in each row an amplifying circuit of "m−1"th stage and an amplifying circuit of "m"th stage are not adjacent to each other, where m is an arbitrary integer number within a range from 2 to N; and a plurality of wirings for respectively leading out a plurality of output signals from the amplifying circuits disposed in one of the plurality of rows.

Further, a semiconductor integrated circuit according to a second aspect of the present invention comprises: N-stage amplifying circuits connected in a form of a ring to perform oscillating operation to output M-phase clock signals having equal phase intervals (M and N are natural numbers and M≦N), which amplifying circuits are arranged in a semiconductor substrate to be divided into two rows; and M wirings for respectively leading out M-phase clock signals from the amplifying circuits disposed in one of the two rows.

According to the present invention, a plurality of wirings are formed such that a plurality of output signals (multi-phase clock signals) are led out or extracted from one row of N-stage amplifying circuits, which are disposed to be divided into a plurality of rows in the semiconductor substrate. Accordingly, it is made possible to equalize the stray capacitances among the multiple-phase clock signal wirings, and therefore, to prevent increase in the area of the substrate and deterioration in the accuracy in clock phase signal wirings.

BRIEF DESCRIPTION OF THE DRAWINGS

Advantages and characteristics of the present invention will become apparent by considering the following detailed descriptions and drawings in conjunction. IN those drawings, the same component elements will be given with the same reference numerals.

BEST MODE FOR CARRYING OUT THE INVENTION

Figure 1:
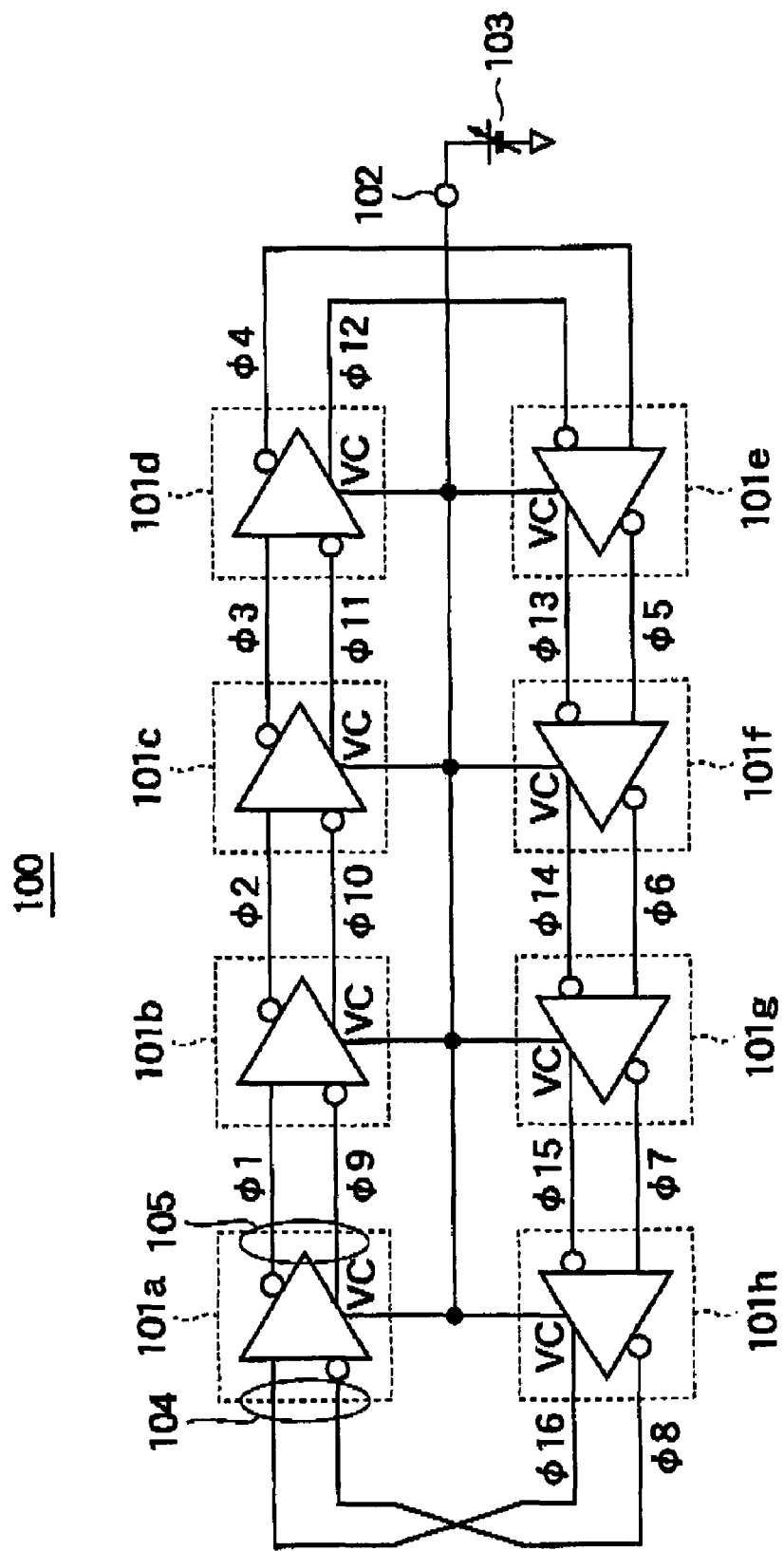
FIG. 1 is a circuit diagram showing a conventional voltage-controlled differential ring oscillator circuit included in a semiconductor integrated circuit that is implemented according to the first embodiment of the layout features of the present invention.

FIG. 1 is a circuit diagram showing a conventional voltage-controlled differential ring oscillator circuit included in a semiconductor integrated circuit that is implemented according to the first embodiment of the layout features of the present invention;

As shown in FIG. 1, a voltage-controlled differential ring oscillator circuit 100 includes N-stage (in this embodiment, 8-stage) delay differential inverting amplification circuits 101a–101h and control terminal 102 for controlling the delay time in the delay differential inverting amplification circuit of each stage. Connected to the control terminal 102 is a control voltage source 103.

Figure 2A:
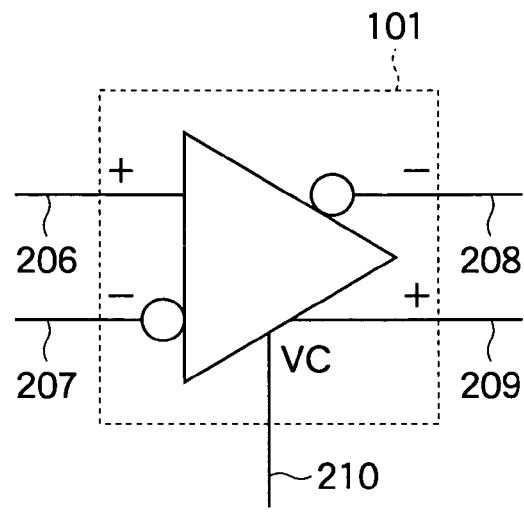
FIGS. 2A and 2B are diagrams showing the delay differential inverting amplification circuits included in the voltage-controlled differential ring oscillator circuit as shown in FIG. 1.

As shown in FIG. 2A, the delay differential inverting amplification circuit 101 of each stage has a non-inverting input terminal 206 and an inverting input terminal 207, and a non-inverting output terminal 208 and an inverting output terminal 209. A control voltage VC, which is applied to the control voltage input terminal 210, controls the delay time in the delay differential inverting amplification circuit 101. Alternatively, a control current may control the delay time in the delay differential inverting amplification circuit 101.

Figure 2B:
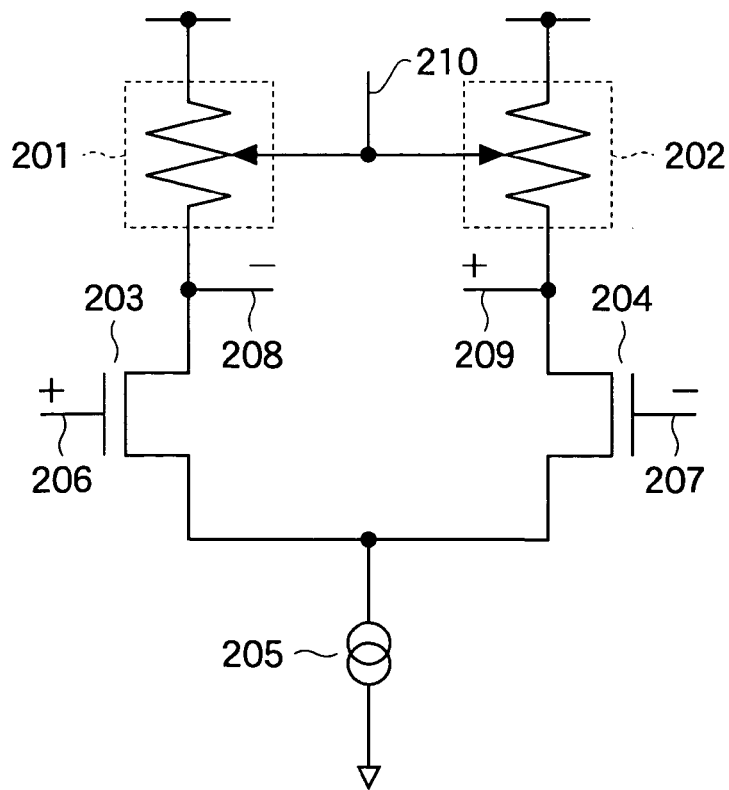

FIG. 2B shows an internal circuit of the delay differential inverting amplification circuit 101 of each stage. The delay differential inverting amplification circuit 101 includes resistors 201 and 202 for varying the voltages, MOS transistors 203 and 204, and a constant current source 205. The delay differential inverting amplification circuit 101 supplies differential signals, which are obtained by amplifying a difference between a signal applied to the non-inverting input terminal 206 and a signal applied to the inverting input terminal 207, to the non-inverting output terminal 208 and the inverting output terminal 209. A voltage between a drain and a source of each of the MOS transistors 203 and 204 is varied by the control voltage VC applied to the control voltage input terminal 210. As a consequence, the delay time in the delay differential inverting amplification circuit 101 is controlled. Although, MOS transistors are used as the amplifying elements in this embodiment, but the present invention is applicable to a case where amplifying elements other than that is used.

Referring to FIG. 1 again, the voltage-controlled differential ring oscillator circuit 100 includes 8-stage delay differential inverting amplification circuits 101a–101h connected in the form of a ring. The delay differential inverting amplification circuit of each stage has a differential input terminal pair 104 and a differential output terminal pair 105. The differential output terminal pair 105 of the delay differential inverting amplification circuit 101a of the first stage is connected to the differential input terminal pair 104 of the delay differential inverting amplification circuit 101b of the second stage, the differential output terminal pair 105 of the delay differential inverting amplification circuit 101b of the second stage is connected to the differential input terminal pair 104 of the delay differential inverting amplification circuit 101c of the third stage, and so on. Thus, finally the differential output terminal pair 105 of the delay differential inverting amplification circuit 101h of the last 8th stage is connected to the differential input terminal pair 104 of the delay differential inverting amplification circuit 101a of the first stage in the form of cross connection. As a result, 8-stage delay differential inverting amplification circuits 101a–101h, which are connected in the form of a ring as described above, produce output clock signals φ1–φ16 from respective differential output terminal pairs 105.

Figure 3:
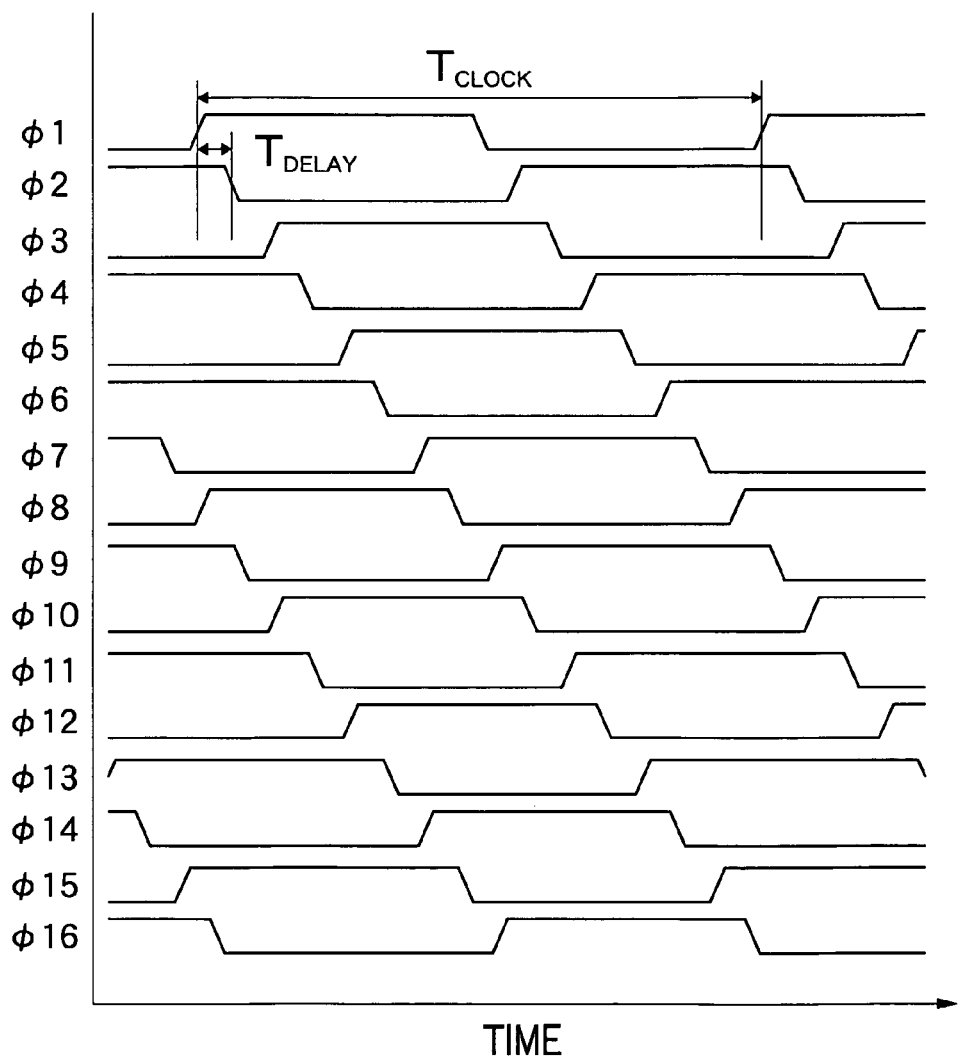
FIG. 3 is a diagram showing voltage waveform of multi-phase clock signals which are outputted from the delay differential inverting amplification circuits included in the voltage-controlled differential ring oscillator circuit as shown in FIG. 1.

FIG. 3 shows voltage waveform of the clock signals φ1–φ16. In FIG. 3, the abscissa axis indicates the time, while the ordinate axis indicates the voltage. The delay differential inverting amplification circuit of each stage inverts and outputs the signal being delayed by a unit delay time $T_{DELAY}$, which is determined by the applied control voltage VC, with respect to the input signal. Here, in the differential ring oscillator circuit constituted of N-stage delay differential inverting amplification circuits, cycle period $T_{CLOCK}$, which is a reciprocal of oscillation frequency, is expressed by the following formula:

$$T_{CLOCK}=2 \times N \times T_{DELAY}=16 \times T_{DELAY} \qquad (1)$$

As demonstrated in the formula (1), the cycle period $T_{CLOCK}$ of the differential ring oscillator circuit depends on the number of stages N of the delay differential inverting amplification circuits and the unit delay time $T_{DELAY}$ in each stage. In the differential ring oscillator circuit as described above, in order to obtain a high oscillation frequency when a control voltage leading to minimum delay time is applied, it is required to design such that the number of stages of the delay differential inverting amplification circuits is to be at minimum, and the stray capacitances in the output wirings of the delay differential inverting amplification circuits is to be small so that the unit delay time $T_{DELAY}$ becomes small.

By the way, in order to achieve a high-speed serial communication, there are required multi-phase clock signals having a phase difference of equal intervals. The number of phases of the multi-phase clock signals depends on the number of serial data which correspond to one parallel data. Generally, multi-phase clock signals having 4–10 phases are required. Now, a method will be described of selecting the multi-phase clock signals having phase difference of equal intervals, which are required for carrying out high-speed serial communication, from the clock signals φ1–φ16 as shown in FIG. 3.

Generally, in order to generate M-phase clock signals, differential ring oscillator circuit having delay differential inverting amplification circuits of N=n×M stages can be used (n is a natural number). However, as previously described, since the minimum value of the cycle period $T_{CLOCK}$ in the differential ring oscillator circuit depends on the number of stages of the delay differential inverting amplification circuits and the unit delay time $T_{DELAY}$ of each stage. Therefore, in order to obtain a high oscillation frequency required for serial communication, it is preferred that the number of stages is at minimum as required. Accordingly, a condition of n=1 is selected, generally. However, the present invention is also applicable to a case of n>1. In this embodiment, there is adopted a configuration having 8-stage delay differential inverting amplification circuits, in which n is 1, i.e., N is M, so as to generate 8-phase clock signals.

In order to obtain multi-phase clock signals of 8 phases having phase difference of equal intervals from the clock signals output from these delay differential inverting amplification circuits, clock signals are selected which are different in phase by an amount of the time as large as cycle period $T_{CLOCK}$ divided by 8. Referring to FIG. 3, as such clock signals, the following clock signals are suitable, that is, the clock signals of odd numbers φ1, φ3, φ5, . . . , and φ15 or the clock signals of even numbers φ2, φ4, φ6, . . . , and φ16. In this embodiment, the clock signals of odd numbers are selected. However, the same effect can be obtained as well by selecting the clock signals of even numbers.

Figure 4:
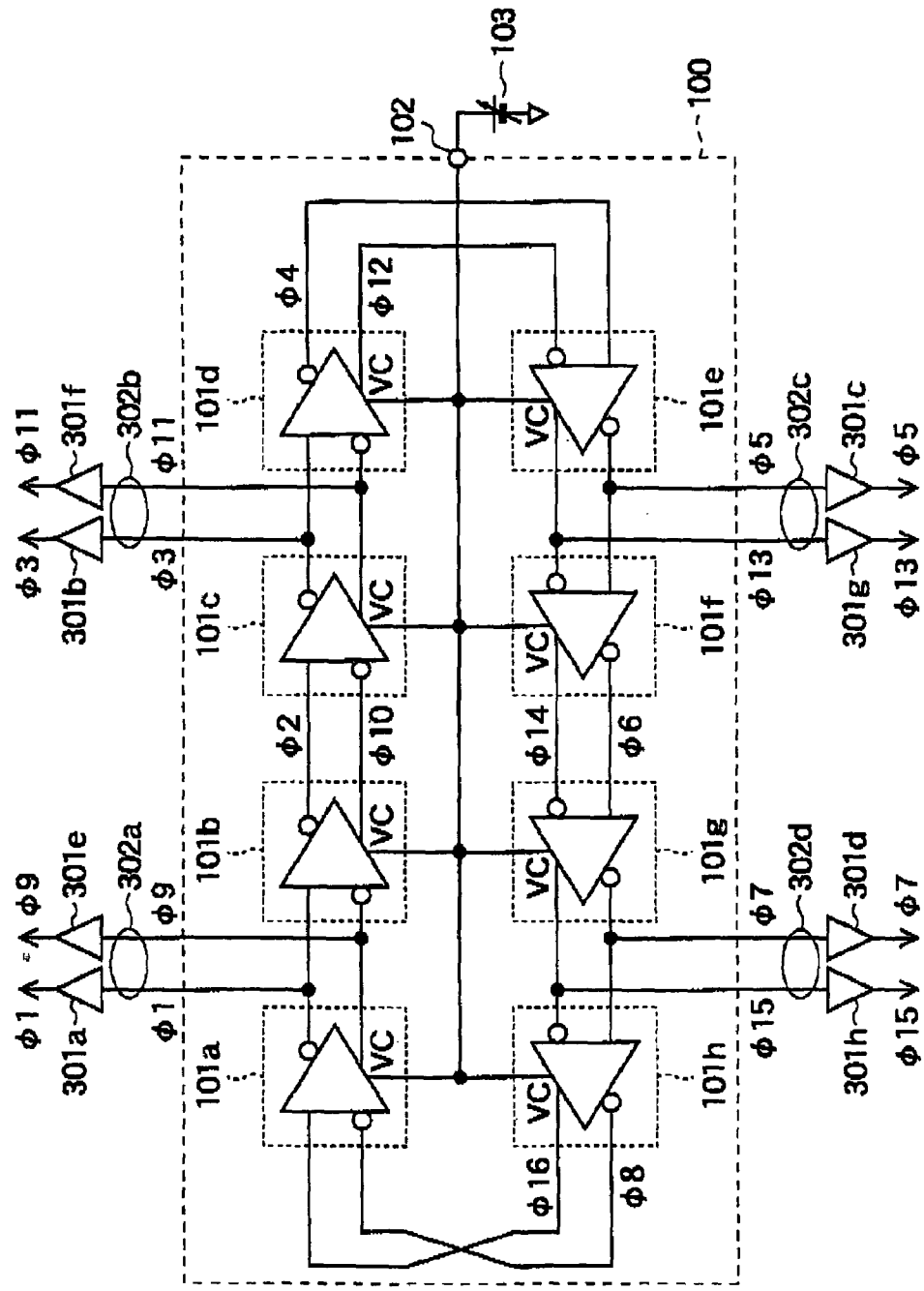
FIG. 4 is a circuit diagram showing conventional voltage-controlled differential ring oscillator circuits and buffer circuits which are included in the semiconductor integrated circuit and are implemented according to the first embodiment of the layout features of the present invention.

FIG. 4 is a circuit diagram showing a conventional voltage-controlled differential ring oscillator circuit and buffer circuits which are included in the semiconductor integrated circuit that is implemented according to the first embodiment of the layout features of the present invention. Here, there are added eight buffer circuits 301a–301h for outputting clock signals φ1, φ3, φ5, . . . , and φ15 of odd numbers as the multi-phase clock signals to the voltage-controlled differential ring oscillator circuit 100 as shown in FIG. 1.

To reduce the stray capacitances in the output wirings of the delay differential inverting amplification circuits, there is a need to design the layout and wirings such that possible shortest outgoing lines 302a–302d of the multi-phase clock signals extending from the delay differential inverting amplification circuits 101a–101h to the buffer circuits 301a–301h can be obtained when forming the circuit as shown in FIG. 4 on a semiconductor substrate.

Figure 5:
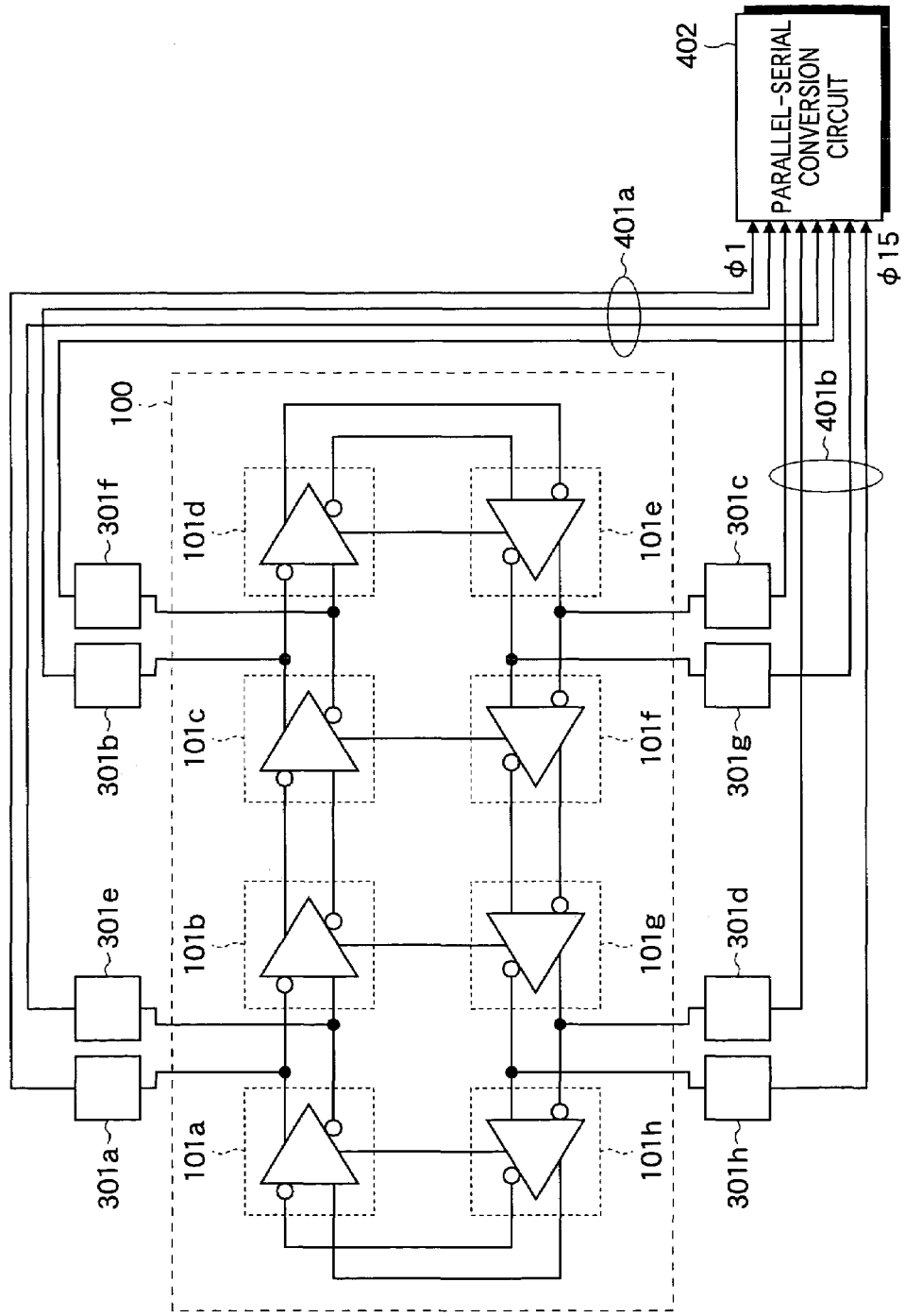
FIG. 5 is a diagram showing an example of the layout and wirings for leading out multi-phase clock signals from a voltage-controlled differential ring oscillator circuit.

To achieve the above, the layout and wirings as shown in FIG. 5 is conceivable. As shown in FIG. 5, the delay differential inverting amplification circuits 101a–101h are disposed in two rows. In each row, the delay differential inverting amplification circuits except for the both ends are disposed adjacent to each other. Further, the buffer circuits 301a–301h are disposed close to the delay differential inverting amplification circuits 101a–101h so that the outgoing lines 302a–302d are as short as possible. By designing the layout and wirings as described above, it is made possible to obtain the minimum length of the wirings for connecting stages and thereupon equalize and minimize the stray capacitances due to the wirings connecting adjacent stages. However, according to the wirings as described above, the wirings for supplying clock signals φ1, φ3, φ5, . . . , and φ15 from the buffer circuits 301a–301h to a parallel-serial conversion circuit 402 are arranged to be divided into the upper side and the lower side of the voltage-controlled differential ring oscillator circuit 100 and led about. As a result, there occurs a great difference between the stray capacitances of the wirings 401a of the multi-phase clock signals disposed at the upper side and the stray capacitances of the wirings 401b of the multi-phase clock signals disposed at the lower side.

In the high-speed serial communication, it is of importance that the precisely equal phases of the multi-phase clock signals are available. Accordingly, when wiring the multi-phase clock signals on the semiconductor substrate, a great care has to be paid to the layout of the multiple-phase clock signal wirings on the semiconductor substrate. That is, there has to be equalized electromagnetic/capacitive coupling of the multi-phase clock signals among plural clock signals. Further, as shown in FIG. 5, when multiple-phase clock signal wirings are led around in a relatively wide region in the periphery of the voltage-controlled differential ring transmitting circuit 100, this region is unable to be used for another purpose. Accordingly, a large area of the semiconductor substrate is required.

Figure 6:
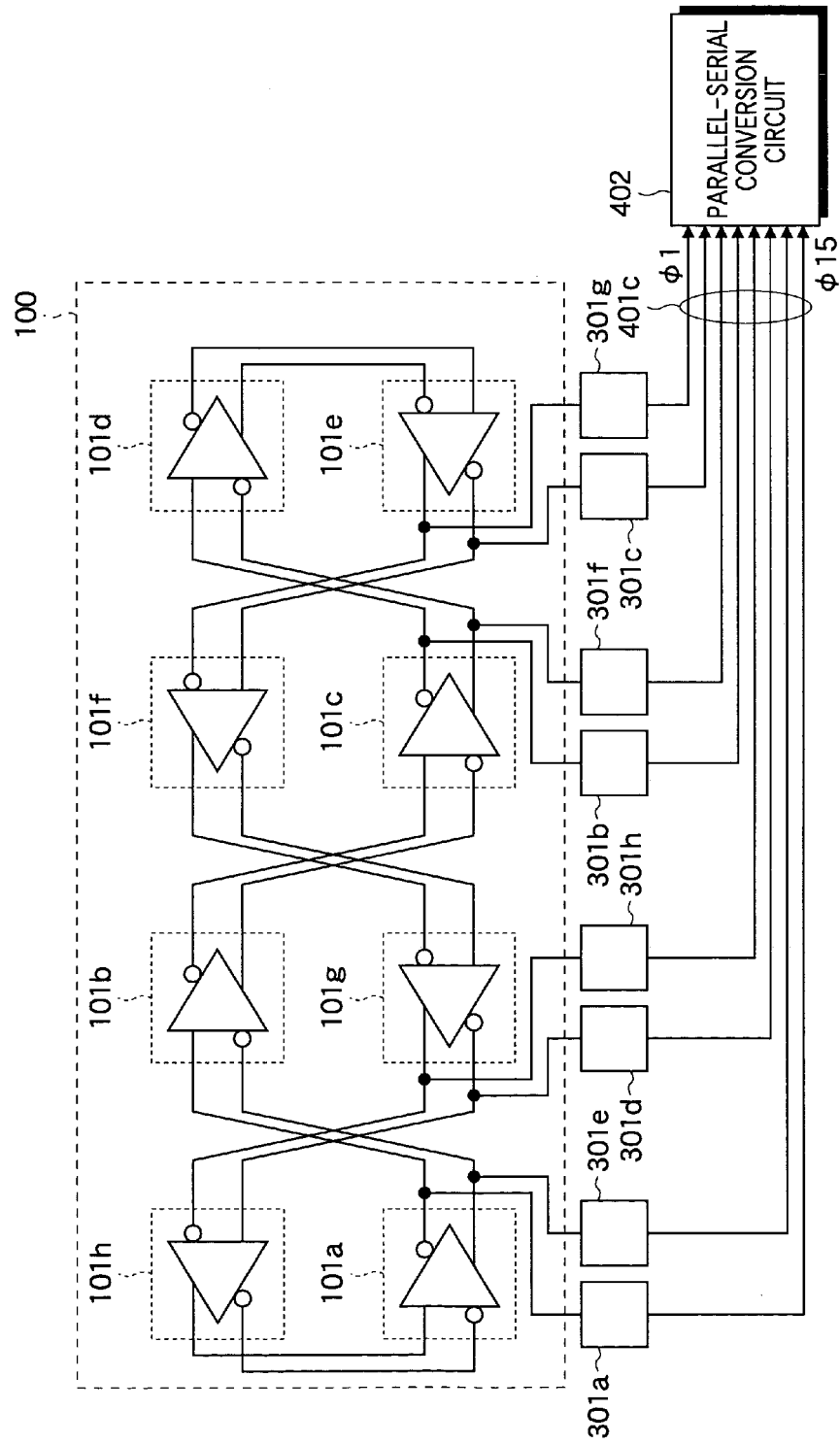
FIG. 6 is a diagram showing the layout and wirings for leading out multi-phase clock signals from the voltage-controlled differential ring oscillator circuit in the semiconductor integrated circuit according to the first embodiment of the present invention.

Thus, in this embodiment, the layout and wirings as shown in FIG. 6 are carried out. As shown in FIG. 6, there are disposed in a semiconductor substrate the voltage-controlled differential ring oscillator circuit 100, buffer circuits 301a–301h for the multi-phase clock signals and the parallel-serial conversion circuit 402. The delay differential inverting amplification circuits 101a–101h, which are connected in the form of a ring in the voltage-controlled differential ring oscillator circuit 100, are alternately disposed in the first and second rows unlike the order of the connection in the circuit. By disposing them alternately as described above, it is made possible to lead out or extract multi-phase clock signals from the delay differential inverting amplification circuits disposed at only one side of the first and second rows. In FIG. 6, it suffices to carry out the wirings such that multi-phase clock signals are led out only from the delay differential inverting amplification circuits 101a, 101g, 101c and 101e which are disposed at the lower side row. Accordingly, the leader wirings 401c for multi-phase clock signals can be all collected at the lower side of the voltage-controlled differential ring oscillator circuit 100. By virtue of this arrangement, the stray capacitances of the multiple-phase clock signal wirings can be equalized.

Figure 7A:
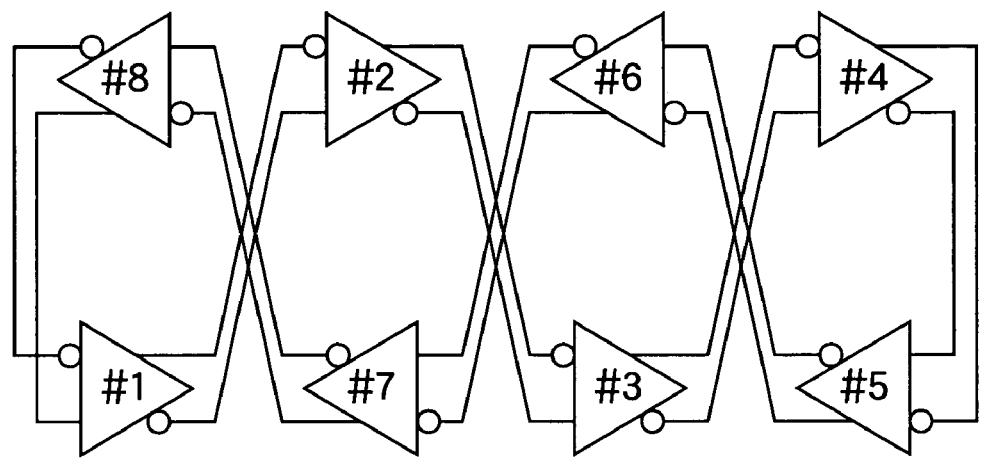
FIG. 7A is an explanatory diagram for illustrating the layout of the delay differential inverting amplification circuits as shown in FIG. 6.
Figure 7B:
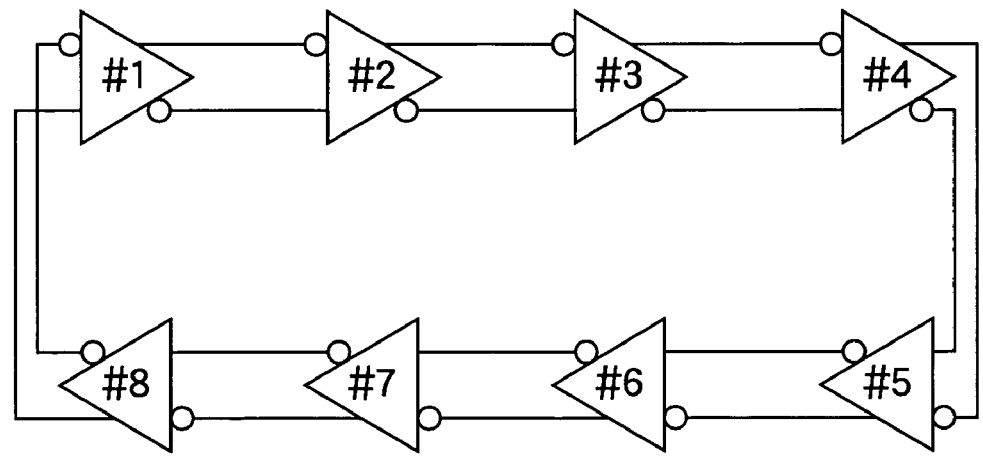
FIG. 7B is an explanatory diagram for illustrating the layout of the delay differential inverting amplification circuits as shown in FIG. 5.

FIG. 7A is an explanatory diagram for illustrating the layout of the 8-stage delay differential inverting amplification circuits as shown in FIG. 6; while FIG. 7B is an explanatory diagram for illustrating the layout of the 8-stage delay differential inverting amplification circuits as shown in FIG. 5 for the comparative example. In FIGS. 7A and 7B, the numerals #1–#8 given to the delay differential inverting amplification circuits indicate the order of the connection in the circuit. In the comparative example as shown in FIG. 7B, the order of the connection in the circuit agrees with the disposed order thereof. In the embodiment as shown in FIG. 7A, the order of the connection in the circuit disagrees with the disposed order thereof.

As understood from FIGS. 7A and 7B, the length of the wirings connecting the 8-stage delay differential inverting amplification circuits in this embodiment is longer than the length of the wirings in comparative example. However, the length of the wirings in the embodiment is approximately the same as the wiring length at the both ends of the rows of the delay differential inverting amplification circuits in the comparative example. Accordingly, the high frequency characteristics of the voltage-controlled differential ring oscillator circuit according to this embodiment are not inferior to those of the voltage-controlled differential ring oscillator circuit in the comparative example.

Figure 8:
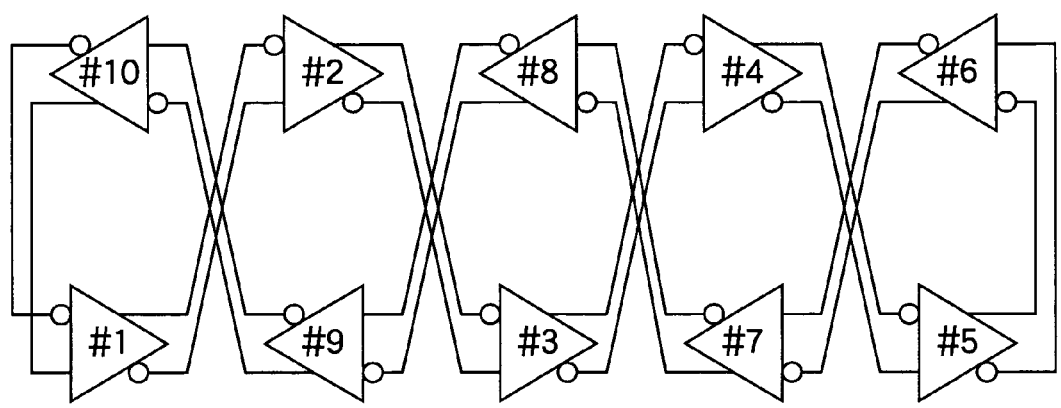
FIG. 8 is a diagram for illustrating the layout of delay differential inverting amplification circuits included in a semiconductor integrated circuit according to a second embodiment of the present invention.

Next, a second embodiment of the present invention will be described. FIG. 8 is a diagram for illustrating the layout of delay differential inverting amplification circuits included in the voltage-controlled differential ring oscillator circuit within a semiconductor integrated circuit according to the second embodiment of the present invention. In this embodiment, the number of stages N of the delay differential inverting amplification circuits is set to be 10. In FIG. 8, the numerals #1–#10 given to the delay differential inverting amplification circuits indicate the order of the connection in the circuit.

As shown in FIG. 8, even when the number of stages of the delay differential inverting amplification circuits which are ring-connected, by disposing these delay differential inverting amplification circuits alternately in a first row and a second row, multi-phase clock signals can be extracted from the delay differential inverting amplification circuits which are disposed in only one of the first and second row. Accordingly, the stray capacitances of the multiple-phase clock signal wirings can be made equal to each other.

Generally, it may be arranged so that, in a case where N-stage delay differential inverting amplification circuits are used, as to provided m=1, 2, . . . , N, an amplifying circuit of the "m"th stage is disposed at the "m"th position of the first row in the semiconductor substrate in a case where m is an odd number equal to or less than N/2, an amplifying circuit of the "m"th stage is disposed at the "N+1−m"th position of the first row in the semiconductor substrate in a case where m is an odd number larger than N/2, an amplifying circuit of the "m"th stage is disposed at the "m"th position of the second row in the semiconductor substrate in a case where m is an even number equal to or less than N/2, and an amplifying circuit of the "m"th stage is disposed at the "N+1−m"th position of the second row in the semiconductor substrate in a case where m is an even number larger than N/2.

Although the present invention has been described based on the embodiments, the present invention is not limited to the above-described embodiments, but may be modified or changed within the range set forth in claims.

INDUSTRIAL APPLICABILITY

The semiconductor integrated circuit according to the present invention can be used in imaging devices, computers and soon, which uses a ring oscillator circuit for generating multi-phase clock signals having phase difference of equal intervals.

The invention claimed is:

1. A semiconductor integrated circuit, comprising:
N-stage amplifying circuits, where N is a natural number, connected in a form of a ring to perform oscillating operation, said N-stage amplifying circuits being arranged in a semiconductor substrate to be divided into a plurality of rows, wherein in each row an amplifying circuit of "m−1"th stage and an amplifying circuit of "m"th stage are not adjacent to each other, where m is an arbitrary integer number within a range from 2 to N; and
a plurality of wirings for respectively leading out a plurality of output signals from said amplifying circuits disposed in one of said plurality of rows.

2. A semiconductor integrated circuit according to claim 1, wherein said N-stage amplifying circuits are arranged in the semiconductor substrate to be divided into two rows, and an amplifying circuit of "2i−1"th stage is disposed in a first row and an amplifying circuit of "2i"th stage is disposed in a second row, where i=1, 2, . . . N/2.

3. A semiconductor integrated circuit according to claim 1, where m=1, 2, . . . , and N, wherein:
an amplifying circuit of "m"th stage is disposed at "m"th position of a first row in the semiconductor substrate in a case where m is an odd number not larger than N/2;
an amplifying circuit of the "m"th stage is disposed at "N+1−m"th position of the first row in the semiconductor substrate in a case where m is an odd number larger than N/2;
an amplifying circuit of the "m"th stage is disposed at the "m"th position of a second row in the semiconductor substrate in a case where "m" is an even number not larger than N/2; and
an amplifying circuit of the "m"th stage is disposed at the "N+1−m"th position of the second row in the semiconductor substrate in a case where "m" is an even number larger than N/2.

4. A semiconductor integrated circuit according to claim 1, wherein each of said N-stage amplifying circuits supplies differential signals, which are obtained by amplifying a difference between a signal applied to a non-inverting input and a signal applied to an inverting input, to a non-inverting output and an inverting output.

5. semiconductor integrated circuit according to claim 1, wherein a delay time in each of said N-stage amplifying circuits is controlled by either one of a control voltage and a control current.

6. A semiconductor integrated circuit, comprising:
a differential ring oscillator circuit including N-stage delay differential amplifying circuits, where N is an integer not less than four, connected in a ring form to perform oscillating operation, each of said N-stage delay differential amplifying circuits having a pair of differential signal input terminals for inputting a differential signal and a pair of differential signal output terminals for outputting a differential signal, and said N-stage delay differential amplifying circuits being arranged to be divided into; a first row and a second row parallel to a predetermined direction within a semiconductor substrate; and
wherein each delay differential amplifying circuit arranged in the second row has (i) the differential signal input terminals connected to the differential signal output terminals of a respective one of the delay differential amplifying circuits arranged in the first row and (ii) the differential signal output terminals connected to the differential signal input terminals of a respective another of the delay differential amplifying circuits arranged in the first row.

7. A semiconductor integrated circuit, comprising:
N-stage amplifying circuits connected in a form of a ring to perform oscillating operation to output M-phase clock signals having equal phase intervals, where M and N are natural numbers and M≦N, said N-stage amplifying circuits being arranged in a semiconductor substrate to be divided into two rows; and
M wirings for respectively leading out M-phase clock signals from said amplifying circuits disposed in one of said two rows,
wherein M is equal to N.

8. A semiconductor integrated circuit, comprising:
N-stage amplifying circuits connected in a form of a ring to perform oscillating operation to output M-phase clock signals having equal phase intervals, where M and N are natural numbers and M≦N, said N-stage amplifying circuits being arranged in a semiconductor substrate to be divided into two rows; and
M wirings for respectively leading out M-phase clock signals from said amplifying circuits disposed in one of said two rows,
where i=1, 2, . . . , and N/2, wherein:
an amplifying circuit of "2i−1"th stage is disposed in a first row; and
an amplifying circuit of "2i"th stage is disposed in a second row.

9. A semiconductor integrated circuit, comprising:

N-stage amplifying circuits connected in a form of a ring to perform oscillating operation to output M-phase clock signals having equal phase intervals, where M and N are natural numbers and M≦N, said N-stage amplifying circuits being arranged in a semiconductor substrate to be divided into two rows; and M wirings for respectively leading out M-phase clock signals from said amplifying circuits disposed in one of said two rows, where m=1, 2, . . . , and N, wherein:

an amplifying circuit of "m"th stage is disposed at "m"th position of a first row in the semiconductor substrate in a case where m is an odd number not larger than N/2;

an amplifying circuit of the "m"th stage is disposed at "N+1−m"th position of the first row in the semiconductor substrate in a case where m is an odd number larger than N/2;

an amplifying circuit of the "m"th stage is disposed at the "m"th position of a second row in the semiconductor substrate in a case where m is an even number not larger than N/2; and an amplifying circuit of the "m"th stage is disposed at the "N+1−m"th position of the second row in the semiconductor substrate in a case where m is an even number larger than N/2.

\* \* \* \* \*